(12) United States Patent
Nakazawa et al.

(10) Patent No.: US 9,437,476 B2
(45) Date of Patent: Sep. 6, 2016

(54) METHOD OF MANUFACTURING SEMICONDUCTOR DEVICE INCLUDING AIR GAP BETWEEN PATTERNS

(71) Applicant: KABUSHIKI KAISHA TOSHIBA, Tokyo (JP)

(72) Inventors: Keisuke Nakazawa, Yokkaichi (JP); Ichiro Mizushima, Kanazawa (JP); Shinichi Nakao, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/325,789

(22) Filed: Jul. 8, 2014

(65) Prior Publication Data
US 2015/0263114 A1 Sep. 17, 2015

(30) Foreign Application Priority Data
Mar. 12, 2014 (JP) .................................. 2014-49423

(51) Int. Cl.
*H01L 21/3205* (2006.01)
*H01L 21/764* (2006.01)
*H01L 21/28* (2006.01)
*H01L 27/115* (2006.01)

(52) U.S. Cl.
CPC ....... *H01L 21/764* (2013.01); *H01L 21/28273* (2013.01); *H01L 27/11524* (2013.01); *H01L 27/11541* (2013.01); *H01L 27/11543* (2013.01)

(58) Field of Classification Search
CPC .................... H01L 27/0207; H01L 27/11519; H01L 27/11524
USPC .................................. 257/208, 321; 438/594
See application file for complete search history.

(56) References Cited

U.S. PATENT DOCUMENTS

| | | | |
|---|---|---|---|
| 6,092,578 A | 7/2000 | Machida et al. | |
| 2003/0170970 A1 | 9/2003 | Senoo et al. | |
| 2008/0003724 A1* | 1/2008 | Cho | H01L 27/115 438/142 |
| 2013/0134496 A1* | 5/2013 | Ahn | H01L 29/66825 257/321 |
| 2013/0256761 A1* | 10/2013 | Sim | H01L 27/0207 257/208 |
| 2014/0084384 A1* | 3/2014 | Choi | H01L 21/764 257/401 |
| 2015/0108561 A1* | 4/2015 | Kim | H01L 29/42324 257/316 |

FOREIGN PATENT DOCUMENTS

| | | |
|---|---|---|
| JP | 11-233625 | 8/1999 |
| JP | 2009-135172 | 6/2009 |
| JP | 2012-195521 | 10/2012 |
| JP | 2013-030614 | 2/2013 |

* cited by examiner

*Primary Examiner* — Dung Le
(74) *Attorney, Agent, or Firm* — Finnegan, Henderson, Farabow, Garrett & Dunner LLP

(57) ABSTRACT

In one embodiment, a method of manufacturing a semiconductor device includes forming a pattern portion and a flat portion on a substrate, the pattern portion including plural patterns, and the flat portion having a flat surface at a position lower than upper surfaces of the patterns. The method further includes transferring a first film on the substrate to continuously form the first film on the upper surfaces of the patterns and on the flat surface of the flat portion and to form a first air gap between the patterns.

18 Claims, 17 Drawing Sheets

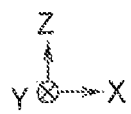 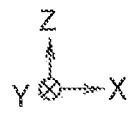 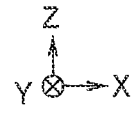
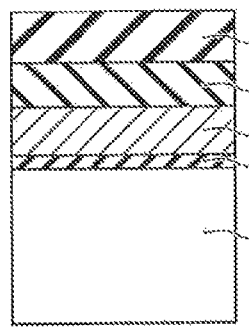 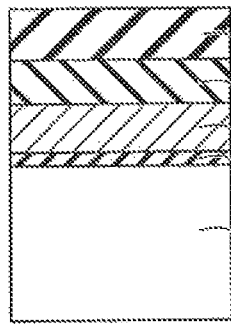 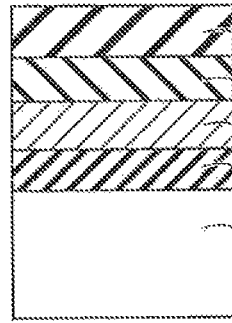
FIG.1A  FIG.1B  FIG.1C
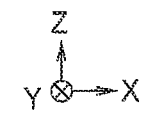 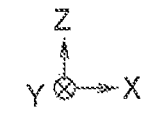 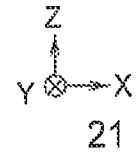
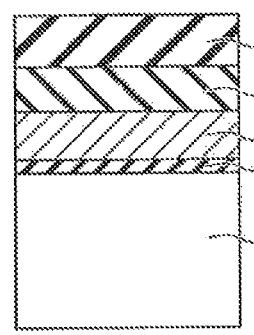 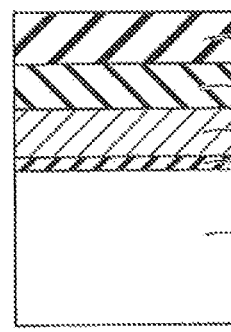 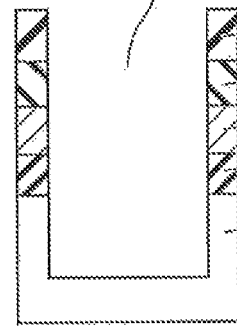
FIG.2A  FIG.2B  FIG.2C

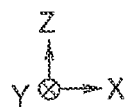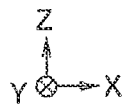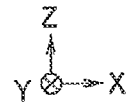
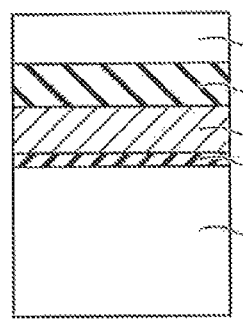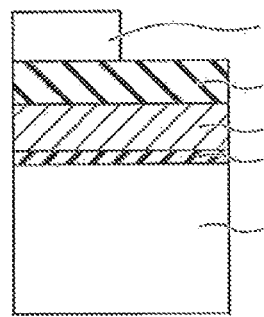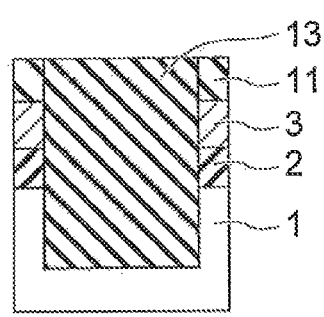
FIG.5A        FIG.5B        FIG.5C
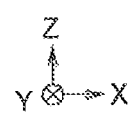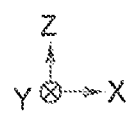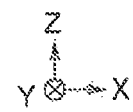
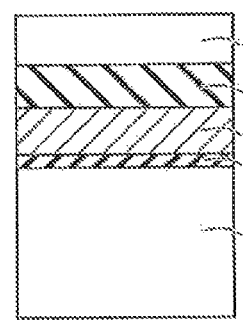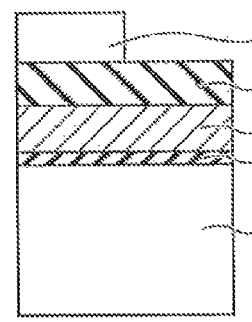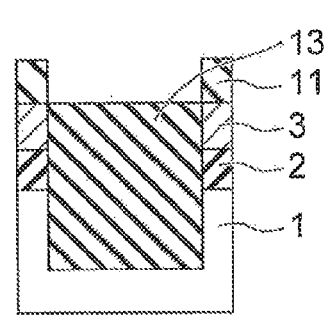
FIG.6A        FIG.6B        FIG.6C

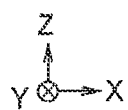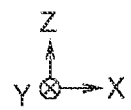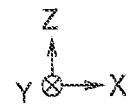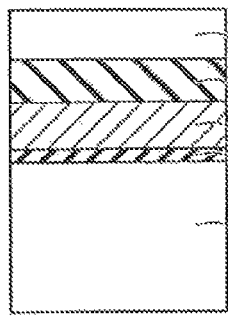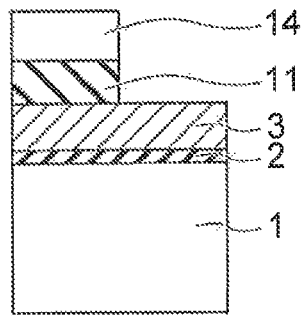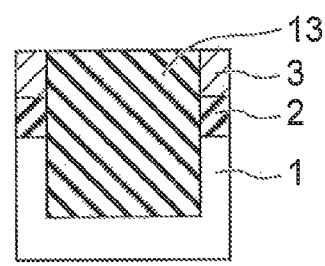
FIG.7A    FIG.7B    FIG.7C
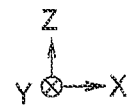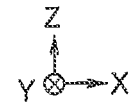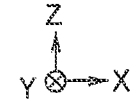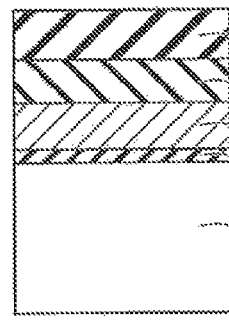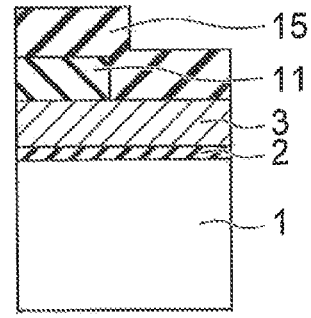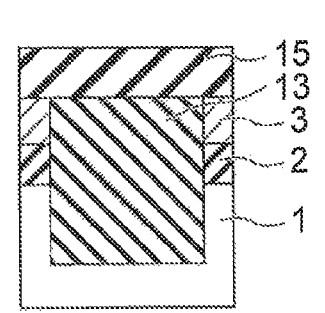
FIG.8A    FIG.8B    FIG.8C

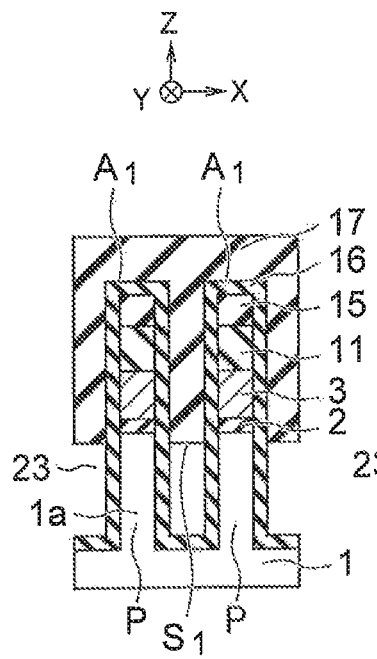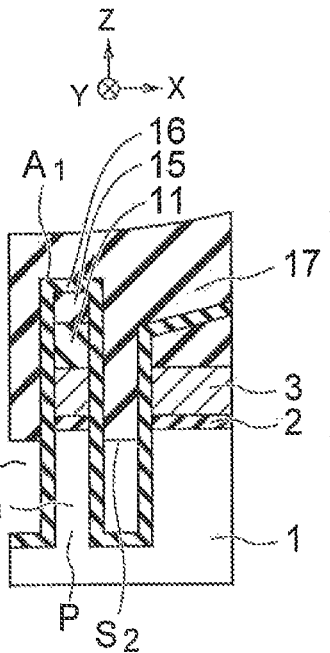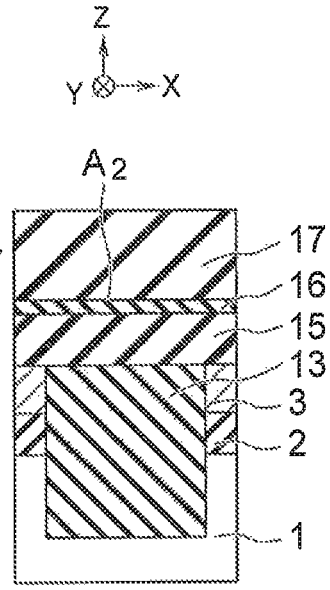
FIG.11A　　　FIG.11B　　　FIG.11C
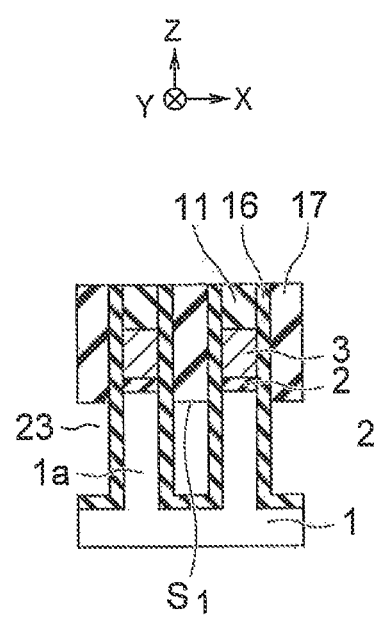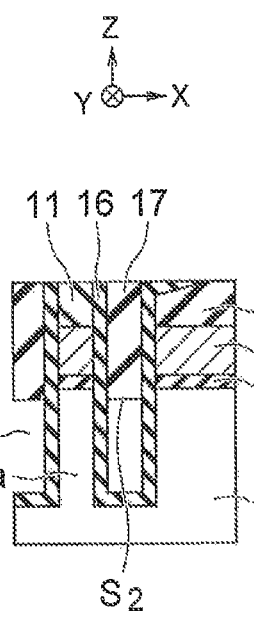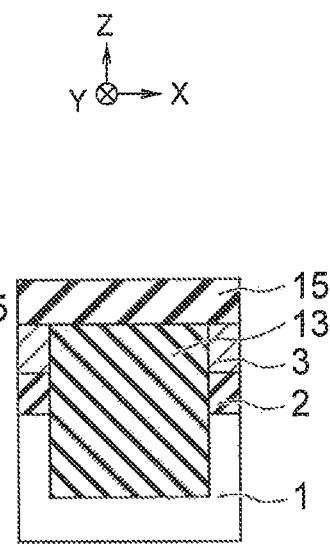
FIG.12A　　　FIG.12B　　　FIG.12C

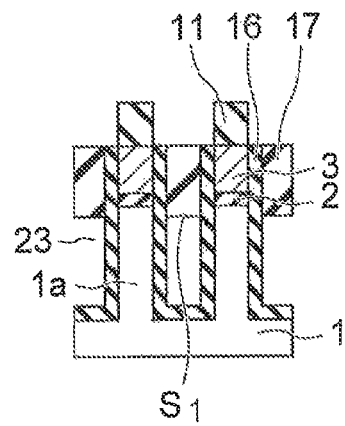
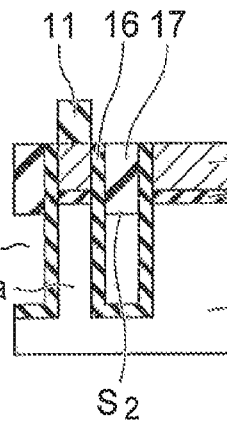
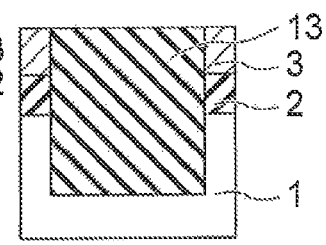
FIG.13A　　　FIG.13B　　　FIG.13C
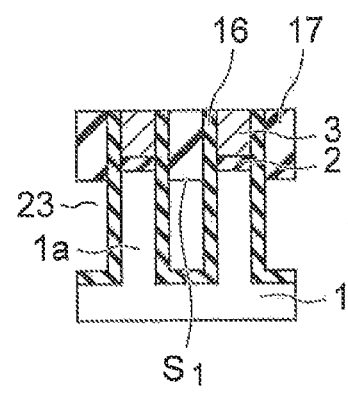
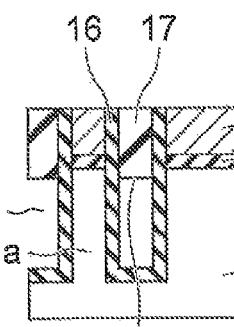
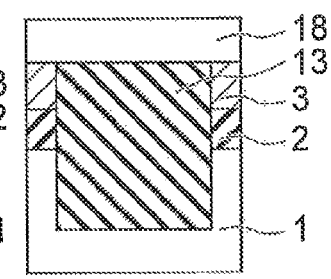
FIG.14A　　　FIG.14B　　　FIG.14C

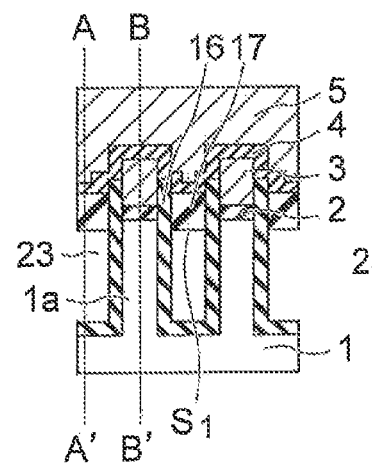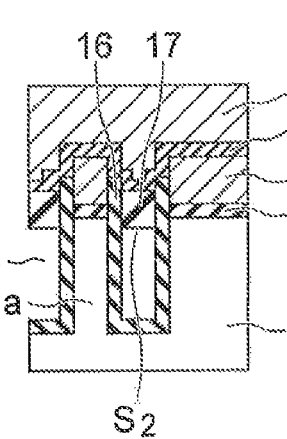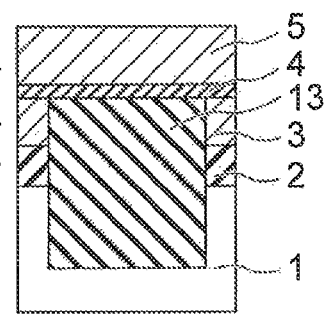
FIG.17A  FIG.17B  FIG.17C
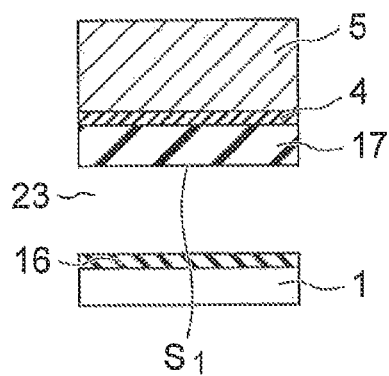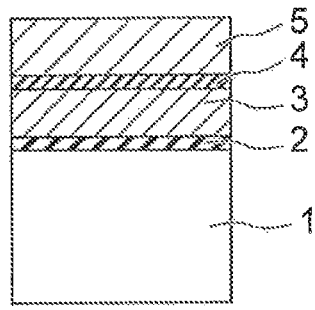
FIG.17D  FIG.17E

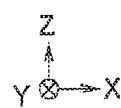 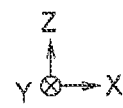 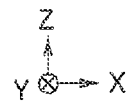
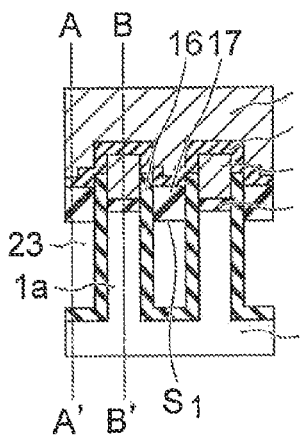 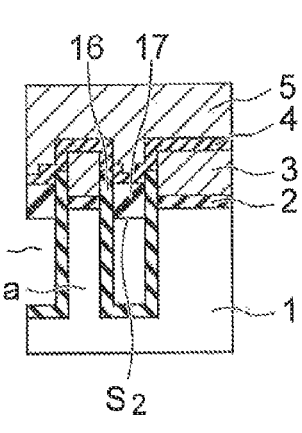 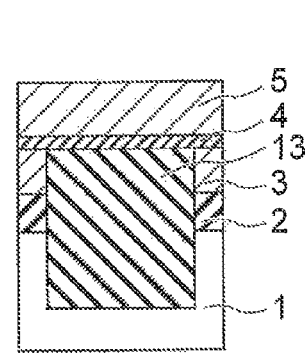
FIG.18A      FIG.18B      FIG.18C
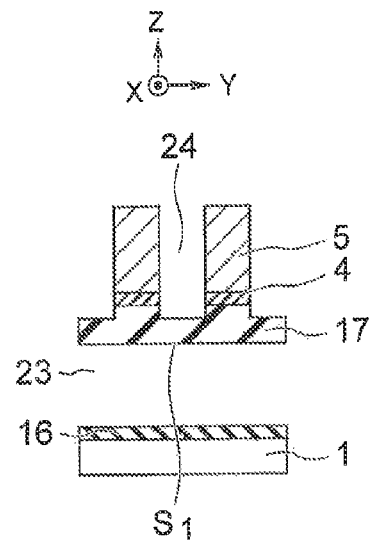 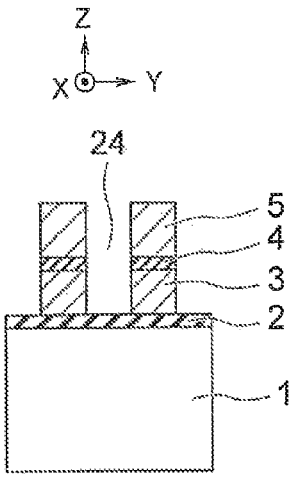
FIG.18D      FIG.18E

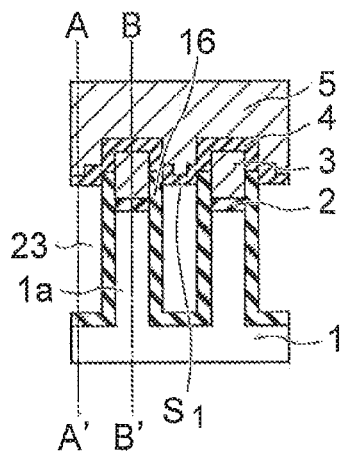
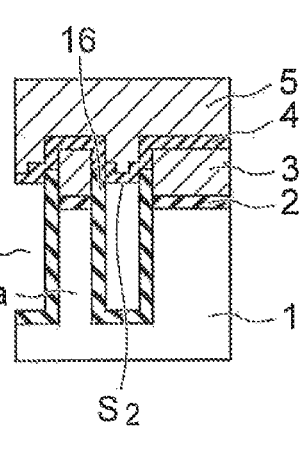
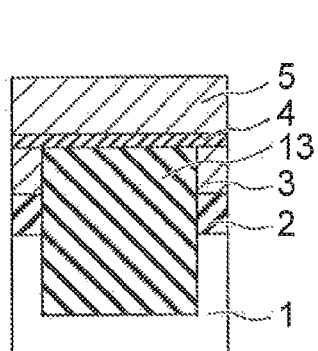
FIG.19A   FIG.19B   FIG.19C
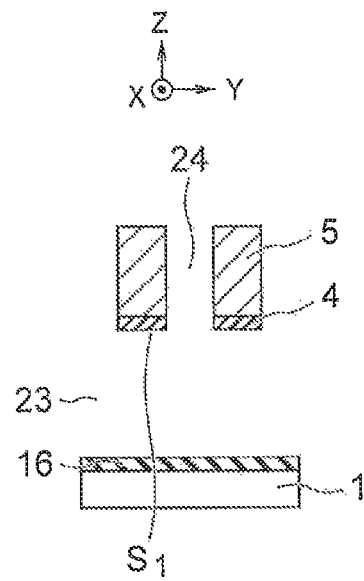
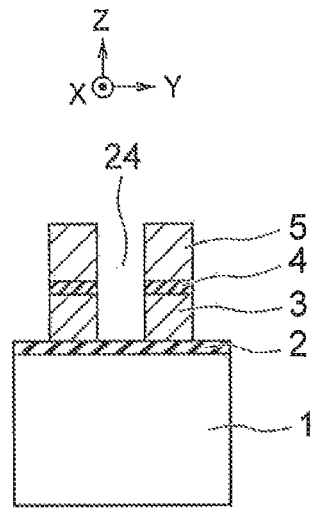
FIG.19D   FIG.19E

METHOD OF MANUFACTURING SEMICONDUCTOR DEVICE INCLUDING AIR GAP BETWEEN PATTERNS

CROSS REFERENCE TO RELATED APPLICATION

This application is based upon and claims the benefit of priority from the prior Japanese Patent Application No. 2014-49423, filed on Mar. 12, 2014, the entire contents of which are incorporated herein by reference.

FIELD

Embodiments described herein relate to a semiconductor device and a method of manufacturing the same.

BACKGROUND

A method is known which is referred to as spin coating film transfer and hot pressing (STP). The STP forms a thin film on a film sheet and presses a substrate on the thin film on the film sheet to transfer the thin film onto the substrate. For example, the STP can be used to form air gaps on the substrate.

BRIEF DESCRIPTION OF THE DRAWINGS

FIGS. 1A to 19E are cross-sectional views illustrating a method of manufacturing a semiconductor device of a first embodiment;

DETAILED DESCRIPTION

Figure 3A:
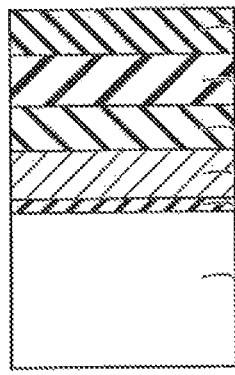

Embodiments will now be explained with reference to the accompanying drawings.

When the air gaps are formed by STP on the substrate on which a pattern portion and a flat portion is provided, an excess of the thin film material in the flat portion may enter gaps between the patterns in the pattern portion near the boundary between the pattern portion and the flat portion. In this case, there is a problem that it is difficult to form the air gaps having a uniform depth.

When the air gaps are formed on the substrate by STP, there is a problem that the degree of adhesion between the substrate and the thin film varies between a region where the width of the gaps between the patterns is small and a region where the width of the gaps between the patterns is large. Therefore, when the film sheet is removed from the substrate, the thin film may not be transferred onto the substrate in the region where the width of the gaps between the patterns is large, and the air gaps may not be formed in this region.

Hereinafter, examples of a method of manufacturing a semiconductor device which can solve these problems will be described with reference to the embodiments.

In one embodiment, a method of manufacturing a semiconductor device includes forming a pattern portion and a flat portion on a substrate, the pattern portion including plural patterns, and the flat portion having a flat surface at a position lower than upper surfaces of the patterns. The method further includes transferring a first film on the substrate to continuously form the first film on the upper surfaces of the patterns and on the flat surface of the flat portion and to form a first air gap between the patterns.

First Embodiment

FIGS. 1A to 19E are cross-sectional views illustrating a method of manufacturing a semiconductor device of a first embodiment.

The device of the present embodiment is a NAND flash memory. FIG. 1A illustrates an active area (AA) cross-section of a cell portion. FIG. 1B illustrates a cross-section near the boundary between the cell portion and a peripheral circuit portion. FIG. 1C illustrates a cross-section of the peripheral circuit portion. The same things are illustrated in FIGS. 2A to 19C. The cell portion and the peripheral circuit portion are examples of a pattern portion and a flat portion, respectively.

As illustrated in FIGS. 1A to 1C, a gate insulator 2, a floating gate material 3, a stopper layer 11 and a hard mask layer 12 are sequentially formed on a substrate 1. The gate insulator 2 is an example of a first insulator. The floating gate material 3 is an example of a first electrode material.

An example of the substrate 1 is a semiconductor substrate such as a silicon substrate. FIGS. 1A to 1C illustrate an X direction and a Y direction that are parallel to a surface of the substrate 1 and are perpendicular to each other, and a Z direction that is perpendicular to the surface of the substrate 1. In this specification, the +Z direction is handled as an upper direction, and the −Z direction is handled as a lower direction. For example, the positional relationship between the substrate 1 and the stopper layer 11 is referred to as that the substrate 1 is placed below the stopper layer 11.

An example of the gate insulator 2 is a silicon oxide film formed by thermal oxidation. The thickness of the gate insulator 2 of the present embodiment varies between the cell portion and the peripheral circuit portion.

An example of the floating gate material 3 is a polysilicon layer of 100 nm in thickness. The floating gate material 3 may be a metal layer, or may be a stack film including a polysilicon layer and a metal layer. Examples of the metal layer are a tungsten silicide (WSi) layer, and a cobalt silicide (CoSi) layer. Another example of the thickness of the floating gate material 3 is 100 to 200 nm.

An example of the stopper layer 11 is a silicon nitride film formed by low pressure chemical vapor deposition (CVD). The stopper layer 11 may be a polysilicon layer of 100 to 200 nm in thickness.

An example of the hard mask layer 12 is a tetraethyl orthosilicate (TEOS) film formed by low pressure CVD.

As illustrated in FIG. 2C, an isolation trench 21 is formed in the peripheral circuit portion by photolithography and dry etching. The isolation trench 21 is formed to penetrate the hard mask layer 12, the stopper layer 11, the floating gate material 3 and the gate insulator 2 and to reach the substrate 1. An example of the depth of the isolation trench 21 is 200 to 500 nm.

Figure 3B:
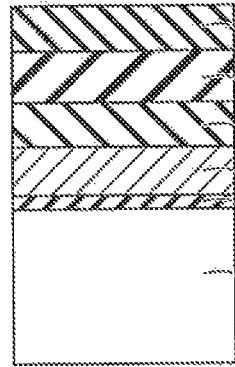
Figure 3C:
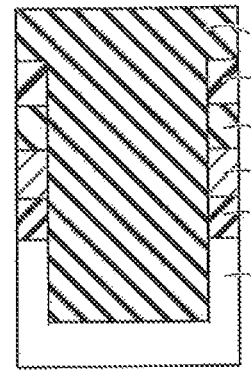

As illustrated in FIGS. 3A to 3C, an isolation insulator 13 is embedded into the isolation trench 21 by high density plasma (HDP).

Figure 4A:
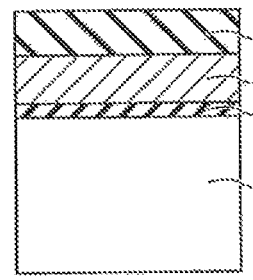
Figure 4B:
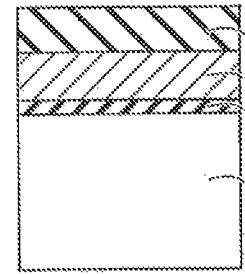
Figure 4C:
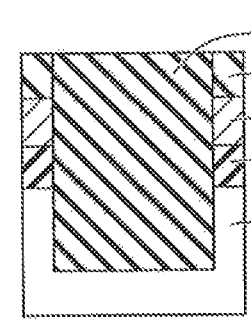

As illustrated in FIGS. 4A to 4C, the surface of the isolation insulator 13 is planarized by chemical mechanical polishing (CMP). As a result, the hard mask layer 12 is removed and the surface of the stopper layer 11 is exposed on the substrate 1.

As illustrated in FIGS. 5A to 5C, a resist layer 14 is formed on the stopper layer 11 in the cell portion.

As illustrated in FIGS. 6A to 6C, the isolation insulator 13 is etched until the height of the upper surface of the isolation insulator 13 is reduced to a height close to the height of the upper surface of the floating gate material 3. The etching may be conducted either in wet etching or dry etching.

As illustrated in FIGS. 7A to 7C, the stopper layer 11 is removed by wet etching using the resist layer 14. As a result, the stopper layer 11 in the peripheral circuit portion is removed. The resist layer 14 is removed after the process of FIGS. 7A to 7C.

As illustrated in FIGS. 8A to 8C, a hard mask layer 15 is formed on the entire surface of the substrate 1 again. As a result, the hard mask layer 15 is formed on the stopper layer 11 in the cell portion, and on the floating gate material 3 and the isolation insulator 13 in the peripheral circuit portion. An example of the hard mask layer 15 is a TEOS film.

In FIGS. 8A to 8C, the stopper layer 11 remains in the cell portion but does not remain in the peripheral circuit portion. Therefore, the height of the upper surface of the hard mask layer 15 in the cell portion is higher than the height of the upper surface of the hard mask layer 15 in the peripheral circuit portion. The thickness of the stopper layer 11 can appropriately be adjusted depending on a void ratio (depth) of air gaps described below.

Figure 9A:
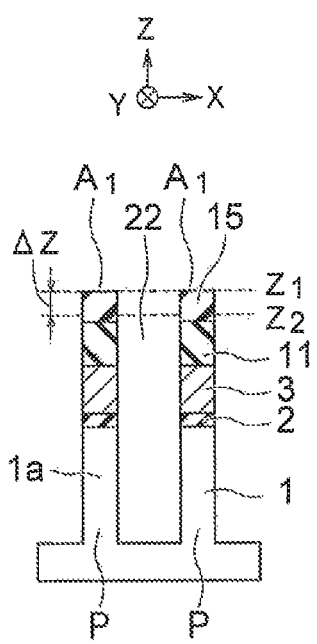
Figure 9B:
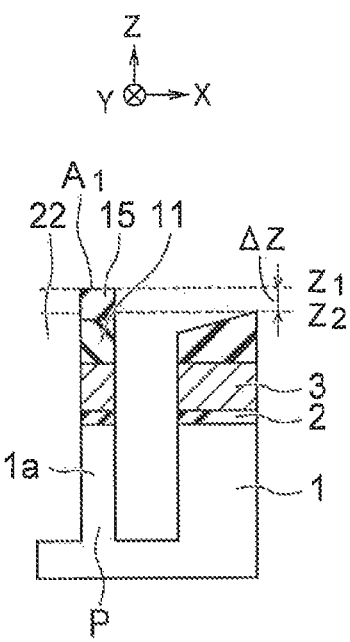
Figure 9C:
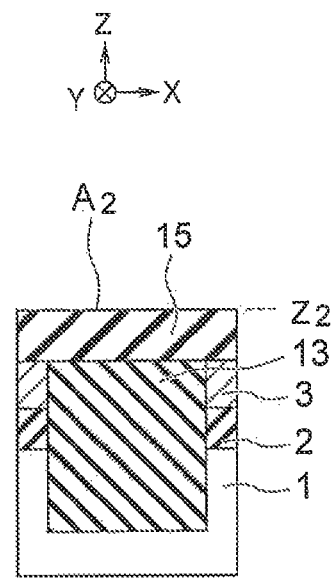

As illustrated in FIGS. 9A to 9C, plural isolation trenches 22 extending in the Y direction are formed in the cell portion by photolithography and dry etching. The isolation trenches 22 are formed to penetrate the hard mask layer 15, the stopper layer 11, the floating gate material 3 and the gate insulator 2 and to reach the substrate 1. An example of the depth of the isolation trenches 22 is 200 to 500 nm. An example of the width of the isolation trenches 22 is equal to or shorter than 30 nm, for example, 5 to 15 nm.

As the result of the process of FIGS. 9A to 9C, plural AA patterns P extending in the Y direction are formed in the cell portion. Each of the AA patterns P includes a device region 1a of the substrate 1, the gate insulator 2, the floating gate material 3, the stopper layer 11, and the hard mask layer 15 that slightly remains. The AA patterns P are an example of plural patterns in the pattern portion.

Reference sign $A_1$ denotes upper surfaces of the AA patterns P in the cell portion. The upper surface $A_1$ of each AA pattern P in FIGS. 9A and 9B is an upper surface of the hard mask layer 15 remaining in the cell portion. A reference sign $A_2$ denotes a flat surface in the peripheral circuit portion. The peripheral circuit portion of the present embodiment includes the flat surface $A_2$ having an area larger than an area of the upper surface $A_1$ of each AA pattern P and having a flat shape. The flat surface $A_2$ in FIG. 9C is an upper surface of the hard mask layer 15 remaining in the peripheral circuit portion.

Reference sign $Z_1$ denotes the height of the upper surfaces $A_1$ of the AA patterns P. Reference sign $Z_2$ denotes the height of the flat surface $A_2$. Reference signs $\Delta Z$ denote the difference between the height $Z_1$ and the height $Z_2$ ($\Delta Z = Z_1 - Z_2$). In the present embodiment, the height $Z_2$ of the flat surface $A_2$ is lower than the heights $Z_1$ of the upper surfaces $A_1$ of the AA patterns P because the stopper layer 11 remains only in the cell portion.

Figure 10A:
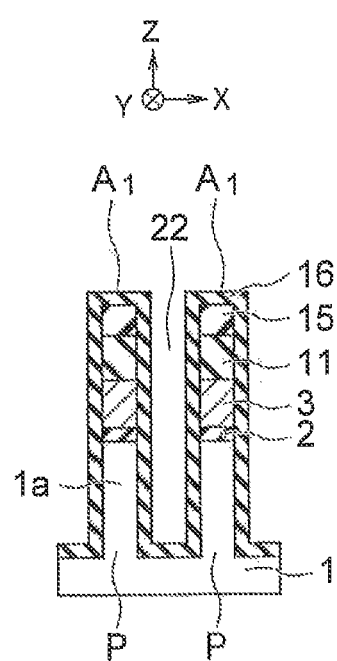
Figure 10B:
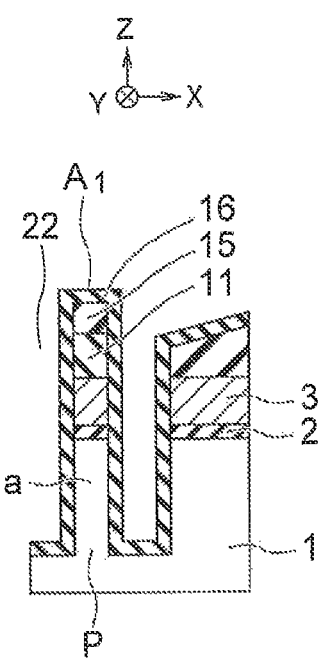
Figure 10C:
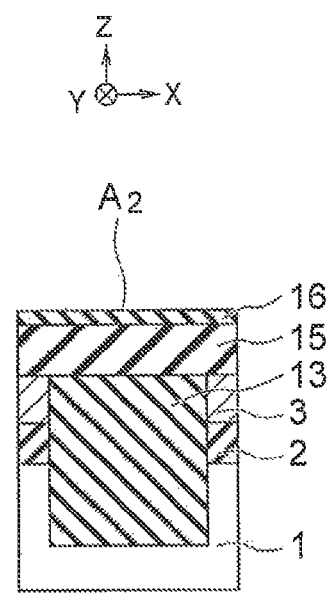

As illustrated in FIGS. 10A to 10C, a liner layer 16 is formed on the entire surface of the substrate 1 by CVD. As a result, an upper surface of the liner layer 16 becomes the upper surfaces $A_1$ of the AA patterns P in FIGS. 10A and 10B. Similarly, the upper surface of the liner layer 16 becomes the flat surface $A_2$ in FIG. 10C. Furthermore, the side surfaces of the AA patterns P in FIGS. 10A and 10B are covered with the liner layer 16. Examples of the liner layer 16 are a silicon oxide film, a TEOS film, and a high temperature oxide (HTO) film. An example of the thickness of the liner layer 16 is 1 to 20 nm.

As illustrated in FIGS. 11A to 11C, a thin film 17 is formed on the entire surface of the substrate 1 by STP. Specifically, the thin film 17 is formed on a film sheet by spin coating, the thin film 17 on the film sheet is baked, and the substrate 1 is pressed on the thin film 17 on the film sheet to transfer the thin film 17 onto the substrate 1. After that, the film sheet is removed from the substrate 1. An example of the thin film 17 is a flowable film, for example, a hydrogen silsesquioxane (HSQ) film or a perhydro polysilazane (PHPS) film. An example of the thickness of the thin film 17 is about 100 nm. The thin film 17 is an example of a first film.

As the result of the process of FIGS. 11A to 11C, the thin film 17 is continuously formed on the upper surfaces $A_1$ of the AA patterns P in the cell portion and on the flat surface $A_2$ in the peripheral circuit portion, and air gaps 23 are formed between the AA patterns P. The air gaps 23 are an example of a first air gap. The void ratio (depth) of the air gaps 23 can be controlled, for example, by adjusting the baking temperature or transfer weighting for the thin film 17.

A reference sign $S_1$ denotes upper surfaces of the air gaps 23 located at a central portion of the cell portion. A reference sign $S_2$ denotes the upper surfaces of the air gaps 23 located at an edge portion of the cell portion. The central portion is a region far away from the boundary between the cell portion and the peripheral circuit portion. The edge portion is a region near the boundary between the cell portion and the peripheral circuit portion. The upper surfaces $S_1$ and $S_2$ of the air gaps 23 in FIGS. 11A and 11B are formed by the thin film 17. The side surfaces and bottom surfaces of the air gaps 23 in FIGS. 11A and 11B are formed by the liner layer 16. The stopper layer 11 and the hard mask layer 15 are an example of one or more second films. The liner layer 16 is an example of a third film.

If the height of the flat surface $A_2$ is the same as the height of the upper surfaces $A_1$ of the AA patterns P, an excess of the material of the thin film 17 in the peripheral circuit portion may enter gaps between the AA patterns P in the cell portion near the boundary between the cell portion and the peripheral circuit portion. In this case, there is a problem that it is difficult to form the air gaps 23 having a uniform depth. In this case, the upper surfaces $S_2$ of the air gaps 23 at the edge portion become lower than the upper surfaces $S_1$ of the air gaps 23 at the central portion.

However, the height of the flat surface $A_2$ in the present embodiment is set lower than the height of the upper surfaces $A_1$ of the AA patterns P. Therefore, the present embodiment makes it possible to prevent the material of the thin film 17 from being excess in the peripheral circuit portion, and to prevent the excess of the material from entering the gaps between the AA patterns P in the cell portion. Accordingly, the present embodiment makes it possible to form the air gaps 23 having an excellent uniformity of depth throughout the cell portion. In FIGS. 11A and 11B, the upper surface $S_2$ of the air gaps 23 at the edge portion has almost the same height as the upper surface $S_1$ of the air gaps 23 at the central portion.

After the process of FIGS. 11A to 11C, the substrate 1 is heat-treated at 230 to 900° C. in oxygen or in steam. As a result, the thin film 17 is transformed into an oxide film and becomes a sacrificial film. Furthermore, the substrate 1 may be heat-treated in a nitrogen atmosphere so as to cure the thin film 17.

As illustrated in FIGS. 12A to 12C, the surface of the thin film 17 is planarized by CMP using the stopper layer 11 as a stopper. As a result, the surface of the stopper layer 11 in the cell portion is exposed on the substrate 1.

As illustrated in FIGS. 13A to 13C, the hard mask layer 15 remaining in the peripheral circuit portion is removed by etching. The etching also removes portions of the liner layer 16 and the thin film 17. The etching can be conducted either in wet etching or dry etching.

As illustrated in FIGS. 14A to 14C, the stopper layer 11 remaining in the cell is removed using a phosphoric acid aqueous solution. After that, the peripheral circuit portion is protected with the resist layer 18.

Figures 15A, 15B, 15C:
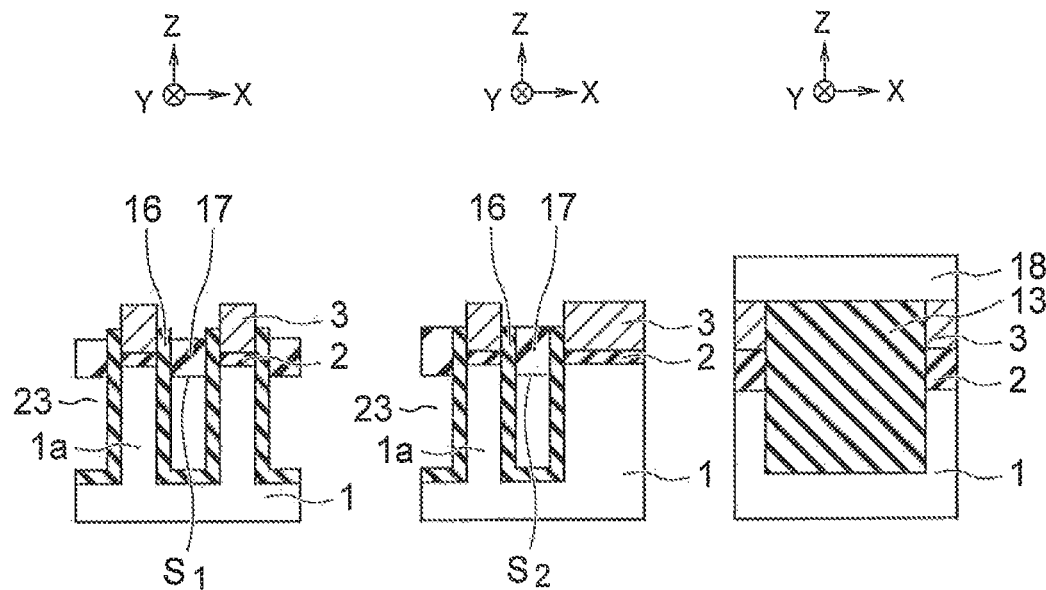

As illustrated in FIGS. 15A to 15C, the etching using the resist layer 18 further removes portions of the liner layer 16 and the thin film 17 in the cell portion. As a result, the upper surface of the thin film 17 becomes lower than the upper surface of the floating gate material 3 in height. After the process of FIGS. 15A to 15C, the resist layer 18 is removed.

Figures 16A, 16B, 16C:
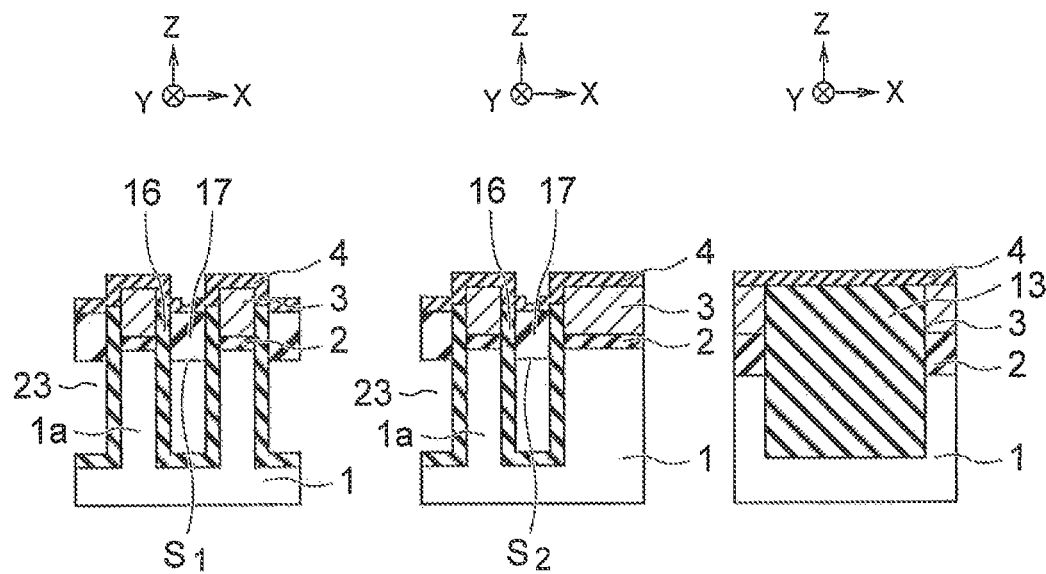
Figures 20A, 20B, 20C:
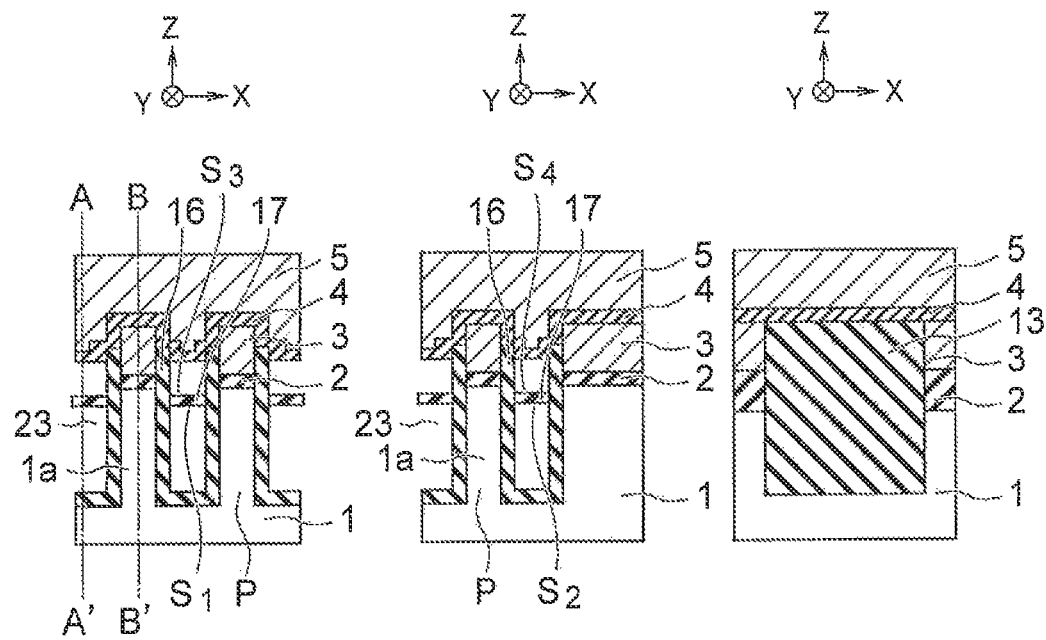
FIGS. 20A to 20E are cross-sectional views illustrating a method of manufacturing a semiconductor device of a variation of the first embodiment.
Figures 20D, 20E:
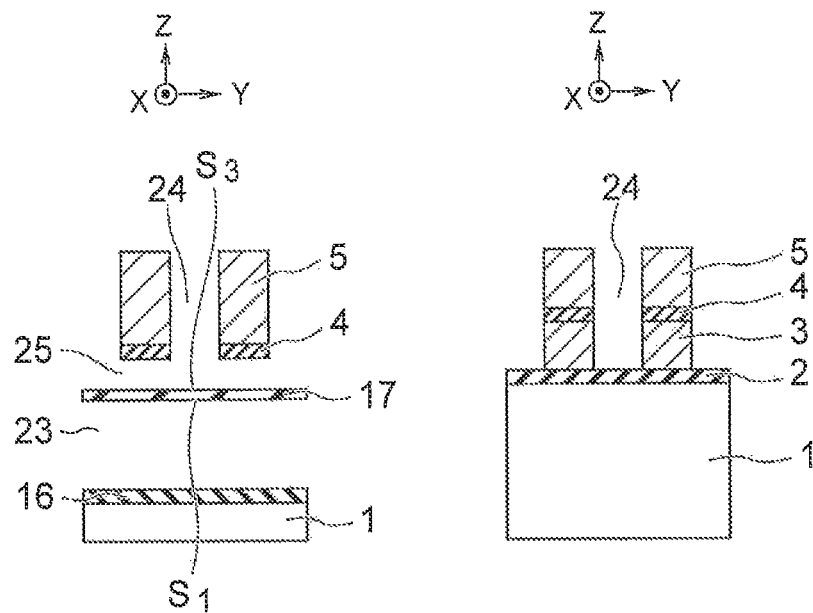

As illustrated in FIGS. 16A to 16C, an intergate insulator 4 is formed on the entire surface of the substrate 1 by CVD. As a result, the intergate insulator 4 is formed, for example, on the upper and side surfaces of the floating gate material 3 and on the upper surface of the thin film 17. The intergate insulator 4 is an example of a second insulator. Examples of the intergate insulator 4 is a first silicon oxide film, a silicon nitride film, and a stack film including a second silicon oxide film. An example of the thickness of the intergate insulator 4 is about 20 nm.

As illustrated in FIGS. 17A to 17E, a control gate material 5 is formed on the intergate insulator 4 by CVD. The control gate material 5 is an example of a second electrode material. An example of the control gate material 5 is a stack film including a polysilicon layer and a metal layer. Examples of the metal layer are a tungsten layer and a nickel silicide (NiSi) layer. An example of the thickness of the control gate material 5 is 50 to 200 nm.

FIG. 17D illustrates a cross-section taken along line A-A' illustrated in FIG. 17A. FIG. 17E illustrates a cross-section taken along line B-B' illustrated in FIG. 17A. FIG. 17E corresponds to a gate conductor (GC) cross-section in the cell portion. The same things are illustrated in FIGS. 18D, 18E, 19D and 19E.

As illustrated in FIGS. 18A to 18E, plural trenches 24 extending in the X direction is formed in the cell portion by photolithography and dry etching. The trenches 24 are formed to penetrate the control gate material 5, the intergate insulator 4 and the floating gate material 3 and to reach the gate insulator 2 and the thin film 17. As a result, cell transistors (and select transistors) are formed on the substrate 1. The control gate material 5 in the cell transistor functions as word lines.

As illustrated in FIGS. 19A to 19E, the thin film 17 remaining in the cell portion is removed by isotropic etching. As a result, the lower surface of the intergate insulator 4 becomes the upper surfaces $S_1$ and $S_2$ of the air gaps 23. This increases the volumes of the air gaps 23. An example of this etching is wet etching.

Portions of the thin film 17 may be removed in the etching without removing whole the thin film 17 (FIGS. 20A to 20E). FIGS. 20A to 20E are cross-sectional views illustrating a method of manufacturing a semiconductor device of a variation of the first embodiment. The process of FIGS. 20A to 20E can be implemented, for example, by stopping the wet etching of the thin film 17 before whole the thin film 17 is removed. In this case, the lower portion of the thin film 17 is left because the chemical for the wet etching shaves the thin film 17 from the upper portion. The thin film 17 in FIGS. 20A to 20E is reft between the side surfaces of the AA patterns P.

As the result of the process of FIGS. 20A to 20E, other air gaps 25 are formed above the air gaps 23 via the thin film 17. The air gaps 23 and 25 are examples of first and second air gaps, respectively. The first air gaps 23 are formed below the thin film 17 between the AA patterns P. The second air gap 25 are formed between the thin film 17 and the intergate insulator 4 between the AA patterns P.

A reference sign $S_3$ denotes the lower surfaces of the second air gaps 25 located at the central portion of the cell portion. A reference sign $S_4$ denotes the lower surfaces of the second air gaps 25 located at the edge portion of the cell portion. In FIGS. 20A to 20E, the lower surfaces $S_4$ of the second air gaps 25 at the edge portion have almost the same height as the lower surfaces $S_3$ of the second air gaps 25 at the central portion.

After that, diffusion layers are formed in the substrate 1, and various inter layer dielectrics, plug layers, interconnect layers and the like are formed on the substrate 1. In this way, the semiconductor device of the present embodiment is manufactured.

(1) Comparative Example of First Embodiment

Figure 21A:
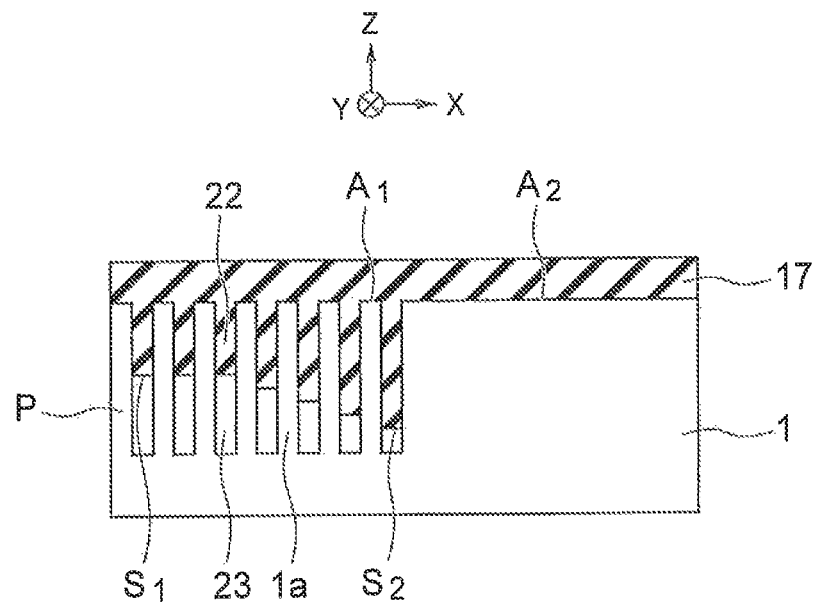
FIGS. 21A and 21B are cross-sectional views for comparing the method of manufacturing the semiconductor device of the first embodiment with its comparative example.
Figure 21B:
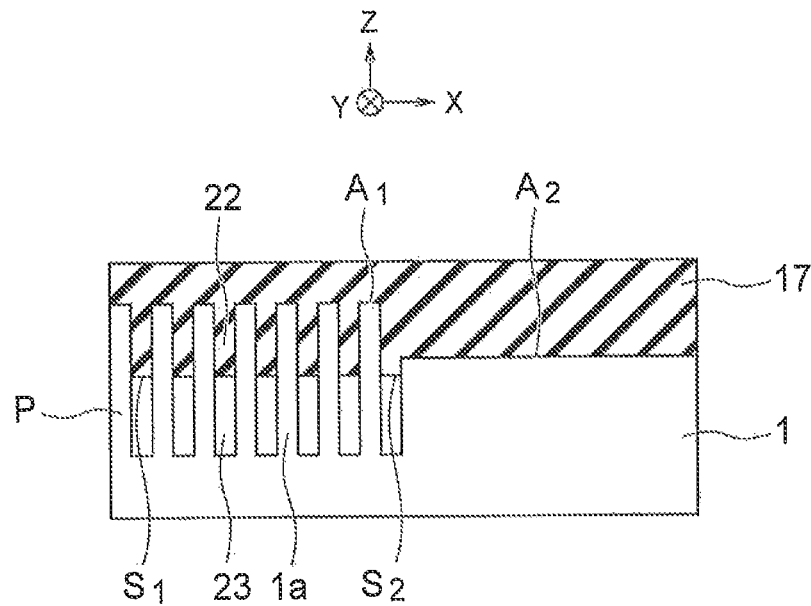

FIGS. 21A and 21B are cross-sectional views for comparing the method of manufacturing the semiconductor device of the first embodiment with its comparative example. FIG. 21A is a cross-sectional view illustrating a process of manufacturing a semiconductor device of the comparative example. FIG. 21B is a cross-sectional view illustrating a process of manufacturing the semiconductor device of the first embodiment.

FIG. 21B schematically illustrates the process of FIGS. 11A to 11C. FIG. 21B illustrates the cell portion, the peripheral circuit portion, and the region near the boundary between the cell portion and the peripheral circuit portion. Meanwhile, FIG. 21A schematically illustrates the process of FIGS. 11A to 11C in a case where the flat surface $A_2$ has the same height as the upper surfaces $A_1$ of the AA patterns P.

In FIG. 21A, the flat surface $A_2$ is set at the same height as the upper surfaces $A_1$ of the AA patterns P. Therefore, an excess of the material of the thin film 17 in the peripheral circuit portion enters the gaps between the AA patterns P in the cell portion near the boundary between the cell portion and the peripheral circuit portion.

On the other hand, in FIG. 21B, the height of the flat surface $A_2$ is set lower than the height of the upper surfaces $A_1$ of the AA patterns P. Therefore, in FIG. 21B, the material of the thin film 17 can be prevented from being excess in the peripheral circuit portion, and this can prevent the excess of the material from entering the gaps between the AA patterns P in the cell portion.

As described above, the height of the flat surface $A_2$ in the peripheral circuit portion in the present embodiment is set lower than the height of the upper surfaces $A_1$ of the AA patterns P in the cell portion. Accordingly, the present embodiment makes it possible to form the air gaps 23 having an excellent uniformity of depth.

In the present embodiment, the height of the flat surface $A_2$ is reduced to a height lower than the height of the upper surfaces $A_1$ of the AA patterns P by using the stopper layer 11. However, the height of the flat surface $A_2$ may be reduced to a height lower than the height of the upper surfaces $A_1$ of the AA patterns P in another manner.

The method of forming the air gaps 23 of the present embodiment is applied to the air gaps 23 in the isolation trenches 22 between the device regions 1a. However, this method can be applied to air gaps in other trenches.

Second Embodiment

Figure 22A:
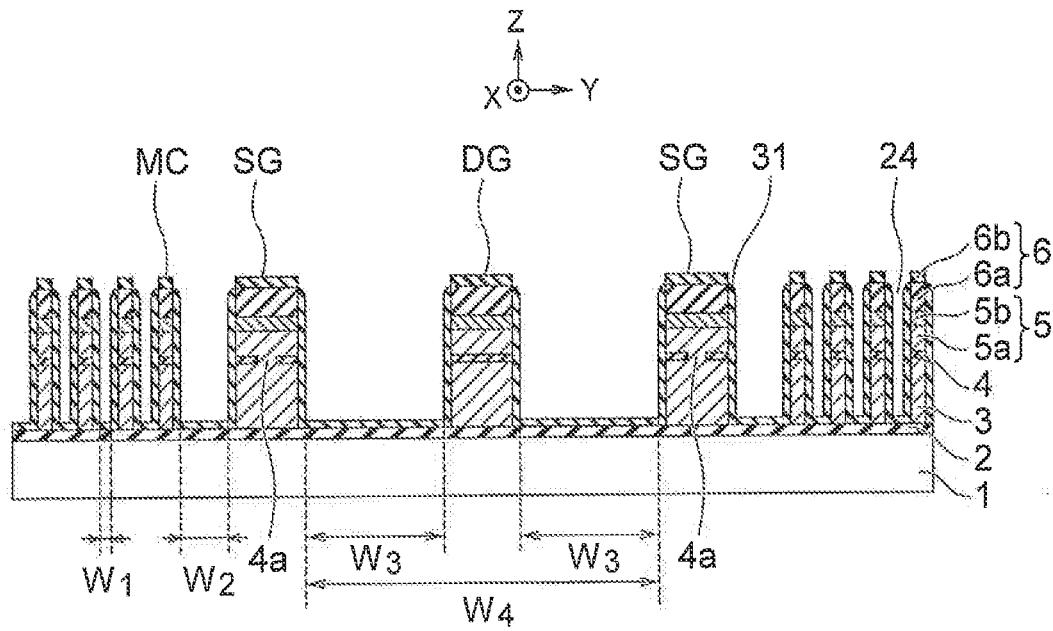
FIGS. 22A and 22B are cross-sectional views illustrating a method of manufacturing a semiconductor device of a second embodiment.
Figure 22B:
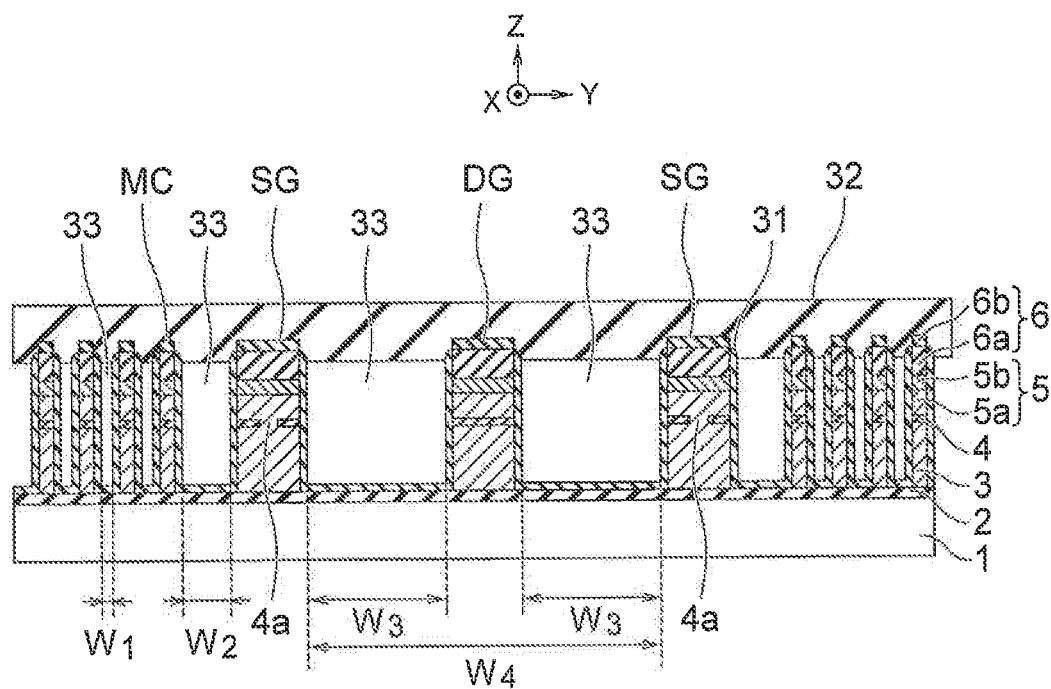

FIGS. 22A and 22B are cross-sectional views illustrating a method of manufacturing a semiconductor device of a second embodiment.

FIG. 22A illustrates the GC cross-section of the cell portion after the process of FIGS. 19A to 19E is conducted. FIG. 22A illustrates the substrate 1, and plural cell transistors MC, plural select transistors SG and a dummy transistor DG that are formed on the substrate 1. The cell transistors MC and the select transistors SG are examples of plural first patterns capable of functioning as transistors. The dummy transistor DG is an example of one or more second patterns incapable of functioning as transistors. The select transistors SG and the dummy transistor DG are formed in the process of FIGS. 18A to 18E, similarly to the cell transistors MC.

The cell transistors MC, the select transistors SG and the dummy transistor DG are formed of the same materials. Specifically, the cell transistors MC, the select transistors SG and the dummy transistor DG are formed of the gate insulator 2, the floating gate material 3, the intergate insulator 4, the control gate material 5 and a mask layer 6 that are sequentially formed on the substrate 1, and a sidewall protection insulator 31 that is formed on the side surfaces of the layers 3 to 6. The control gate material 5 includes first and second gate materials 5a and 5b. The mask layer 6 includes first and second mask layers 6a and 6b.

An example of the first gate material 5a is a polysilicon layer. An example of the second gate material 5b is a metal layer. An example of the first mask layer 6a is a silicon nitride film formed by low pressure CVD. The first mask layer 6a may be a polysilicon layer having a thickness of 100 to 200 nm. An example of the second mask layer 6b is a TEOS film formed by low pressure CVD. An example of the sidewall protection insulator 31 is a silicon oxide film formed by atomic layer deposition (ALD).

The intergate insulator 4 of each select transistor SG includes an opening 4a that electrically connects the floating gate material 3 to the control gate material 5. On the other hand, the intergate insulator 4 of the dummy transistor DG does not include an opening 4a that electrically connects the floating gate material 3 to the control gate material 5. However, the intergate insulator 4 of the dummy transistor DG may include such an opening 4a. The opening 4a is formed by etching of the intergate insulator 4 between the processes of FIGS. 16A to 16C and FIGS. 17A to 17E.

The control gate material 5 of each cell transistor MC is electrically connected to an interconnect on the substrate 1 in the process after the process of FIG. 22A. Similarly, the control gate material 5 of each select transistor SG is electrically connected to an interconnect on the substrate 1 in the process after the process of FIG. 22A. As a result, the cell transistors MC and the select transistors SG of the present embodiment become capable of functioning as transistors.

On the other hand, the control gate material 5 of the dummy transistor DG is not electrically connected to an interconnect on the substrate 1 in the process after the process of FIG. 22A. As a result, the dummy transistor DG of the present embodiment becomes incapable of functioning as a transistor. The dummy transistor DG is formed between the select transistors SG. The dummy transistor DG of the present embodiment has the same size as the select transistors SG. However, the dummy transistor DG can have a different size from the select transistors SG.

Reference signs $W_1$, $W_2$, $W_3$ and $W_4$ will be described. The reference sign $W_1$ denotes the width between mutually adjacent cell transistors MC. The reference sign $W_2$ denotes the width between a cell transistor MC and a select transistor SG which are mutually adjacent. The reference sign $W_3$ denotes the width between a select transistor SG and the dummy transistor DG which are mutually adjacent. The reference sign $W_4$ denotes the width between a select transistor SG adjacent to the dummy transistor DG on one side and a select transistor SG adjacent to the dummy transistor DG on the other side.

FIG. 22A illustrates three types of patterns, which are the cell transistors MC, the select transistors SG and the dummy transistor DG. The widths between mutually adjacent patterns among these patterns include the three types of widths, which are $W_1$, $W_2$ and $W_3$ ($W_4$ is not included because the select transistors SG are not mutually adjacent). The minimum value between these widths is the width $W_1$ between the cell transistors MC. On the other hand, the maximum value between these widths is the width $W_3$ between a select transistor SG and the dummy transistor DG.

In the present embodiment, two or more dummy transistors DG may be formed between the select transistors SG in FIG. 22A. In this case, the widths between the mutually adjacent patterns also include the width between mutually adjacent dummy transistors DG in addition to $W_1$, $W_2$ and $W_3$.

Hereinafter, the minimum and maximum values of the widths between the mutually adjacent patterns are referred to as minimum and maximum widths, respectively. The minimum width in FIG. 22A is the width $W_1$, and the maximum width in FIG. 22A is the width $W_3$.

In the present embodiment, the cell transistors MC, the select transistors SG and the dummy transistor DG are formed such that the maximum width is smaller than 1000 times the minimum width. Furthermore, the cell transistors MC, the select transistors SG and the dummy transistor DG in the present embodiment are preferably formed such that the maximum width is smaller than 100 times the minimum width. Also, the width $W_4$ between the select transistors SG in the present embodiment is equal to or larger than 1000 times or 100 times the width $W_1$ (the minimum width) between the cell transistors MC.

In the process of FIG. 22B, a thin film 32 is formed on the entire surface of the substrate 1 by STP. Examples of a forming method, material and thickness of the thin film 32 is the same as the thin film 17 of the first embodiment. The thin film 32 of the present embodiment is used as an inter layer dielectric. The thin film 32 of the present embodiment is preferably formed of a material that finally changes into a silicon oxide film in order to avoid the alteration of the thin film 32 in a high-temperature process. Examples of such a material is hydrogen silsesquioxane (HSQ) or perhydro polysilazane (PHPS). These materials can form a flowable film. The thin film 32 is an example of a first film.

As the result of the process of FIG. 22B, the thin film 32 is continuously formed on the cell transistors MC, the select transistors SG and the dummy transistor DG, and air gaps 33 are formed between the mutually adjacent patterns among these three types of patterns.

After that, various inter layer dielectrics, plug layers, interconnect layers and the like are formed on the substrate 1. In this way, the semiconductor device of the present embodiment is manufactured.

(1) Comparative Example of Second Embodiment

Figure 23A:
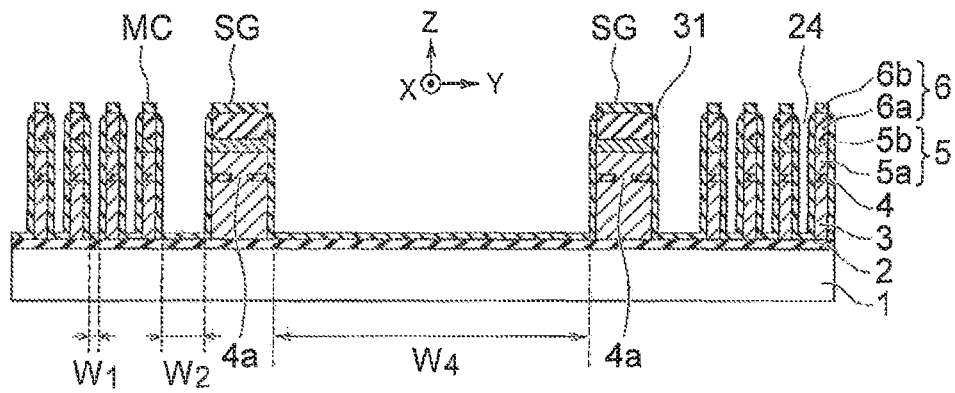
FIGS. 23A to 23C are cross-sectional views illustrating a method of manufacturing a semiconductor device of a comparative example of the second embodiment.
Figure 23B:
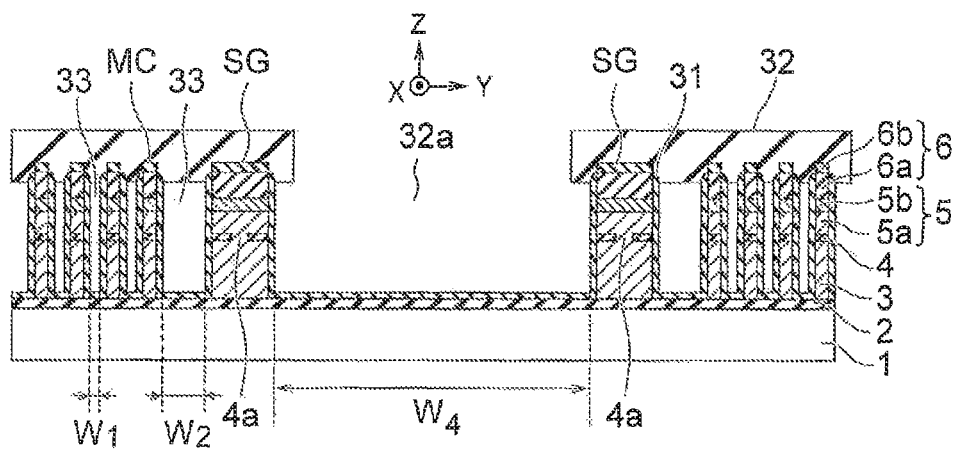
Figure 23C:
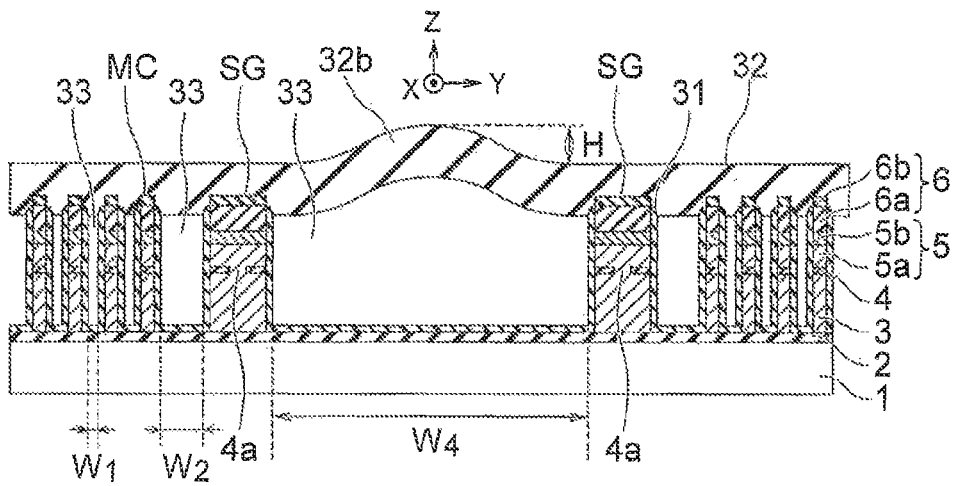

FIGS. 23A to 23C are cross-sectional views illustrating a method of manufacturing a semiconductor device of a comparative example of the second embodiment.

FIG. 23A illustrates, similarly to FIG. 22A, a GC cross-section of a cell portion after the process of FIGS. 19A to 19E is conducted. However, the dummy transistor DG is not formed on the substrate 1 in FIG. 23A. Accordingly, the widths between the mutually adjacent patterns in FIG. 23A include three types of widths, which are $W_1$, $W_2$ and $W_4$. The minimum and maximum widths are the widths $W_1$ and $W_4$, respectively.

When the STP is used in this comparative example, there is a problem that the degree of adhesion between the substrate 1 (more accurately, the patterns on the substrate 1) and the thin film 32 varies between a region where the width of the gaps between the patterns is small and in a region where the width of the gaps between the patterns is large. Specifically, there is a problem that the degree of adhesion in a region where the width between the patterns is $W_4$ is lower than the degree of adhesion in a region there the width between the patterns is $W_1$. Therefore, when the film sheet is removed from the substrate 1, the phenomenon illustrated in FIG. 23B or 23C may be generated.

FIG. 23B illustrates a case where the thin film 32 is not transferred onto the substrate 1 in the region where the width between the patterns is $W_4$ when the film sheet is removed from the substrate 1. A hole 32a is formed on the thin film 32 in this region. As a result, no air gap 33 is formed in this region. Furthermore, when plural holes 32a are formed on the thin film 32, the holes 32a generally have unequal sizes. Therefore, when the plural holes 32a are formed on the thin film 32, it becomes difficult to stably form structures having the same shape on the substrate 1.

FIG. 23C illustrates a case where a bump 32b is generated on the thin film 32 in the region where the width between the patterns is $W_4$ after the film sheet is removed from the substrate 1. If the bump 32b is generated on the thin film 32, it becomes difficult to perform an accurate microfabrication of upper layers than the thin film 32. This may cause the variations in the characteristics of the cell transistors MC and the select transistors SG. A reference sign H denotes the height of the bump 32b.

After an experiment, it is found that the hole 32a as illustrated in FIG. 23B is generated generally when the maximum width is almost equal to or larger than 1000 times the minimum width. Accordingly, in the present embodiment, when the width $W_4$ between the select transistors SG is equal to or larger than 1000 times the width $W_1$ between the cell transistors MC, one or more dummy transistors DG are placed between the select transistors SG. This can reduce the maximum width to a width smaller than 1000 times the minimum width. Accordingly, the present embodiment makes it possible to prevent the hole 32a from being generated, and to form the air gaps 33 across whole the region on the substrate 1.

After the experiment, it is also found that the bump 32b as illustrated in FIG. 23C is generated generally when the maximum width is almost equal to or larger than 100 times the minimum width. Accordingly, in the present embodiment, when the width $W_4$ between the select transistors SG is equal to or larger than 100 times the width $W_1$ between the cell transistors MC, one or more dummy transistors DG are preferably placed between the select transistors SG. This can reduce the maximum width to a width smaller than 100 times the minimum width. Accordingly, the present embodiment makes it possible to prevent the bump 32b from being generated, and to stably form the air gaps 33 across whole the region on the substrate 1.

Figure 24:
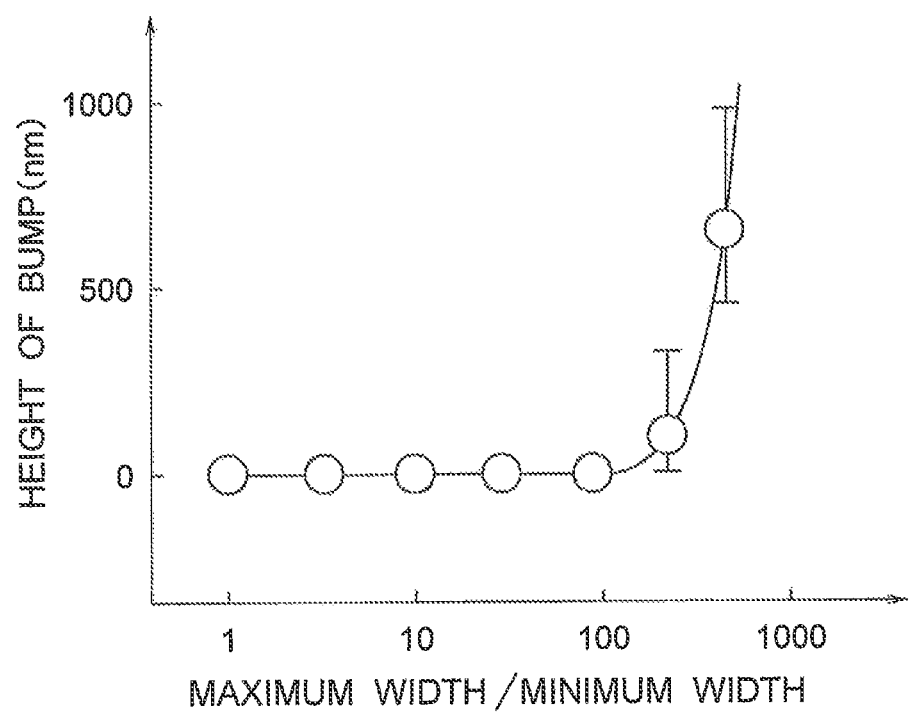
FIG. 24 is a graph showing a relationship between a ratio of a maximum width to a minimum width and a height of a bump in the second embodiment and its comparative example.

FIG. 24 is a graph showing a relationship between the ratio of the maximum width to the minimum width and the height of the bump in the second embodiment and its comparative example.

The horizontal axis in FIG. 24 represents the ratio of the maximum width to the minimum width. In the second embodiment, the ratio of the maximum width to the minimum width is $W_3/W_1$. In the comparative example of the second embodiment, the ratio of the maximum width to the minimum width is $W_4/W_1$. The vertical axis in FIG. 24 represents the height H of the bump 32b. The graph in FIG. 24 shows the experimental results when the minimum width $W_1$ is 20 nm, the thickness of the thin film 32 is 400 nm, and the material of the thin film 32 is polysilazane.

In the graph in FIG. 24, it is found that the bump 32b is generated when the maximum width is almost equal to or larger than 100 times the minimum width. Furthermore, it is found that the height H of the bump 32b increases with an increase of the ratio of the maximum width to the minimum width. In the experiment of FIG. 24, when the maximum width is almost equal to or larger than 1000 times the minimum width, the hole 32a is generated on the thin film 32.

(2) Variation of Second Embodiment

Figure 25A:
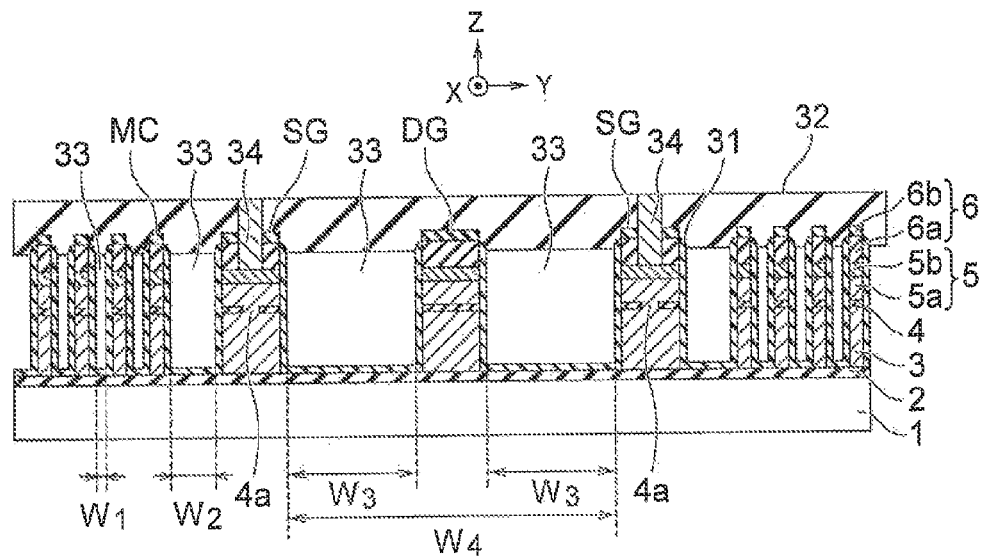
FIGS. 25A and 25B are a cross-sectional view and a plan view illustrating a method of manufacturing a semiconductor device of a variation of the second embodiment.
Figure 25B:
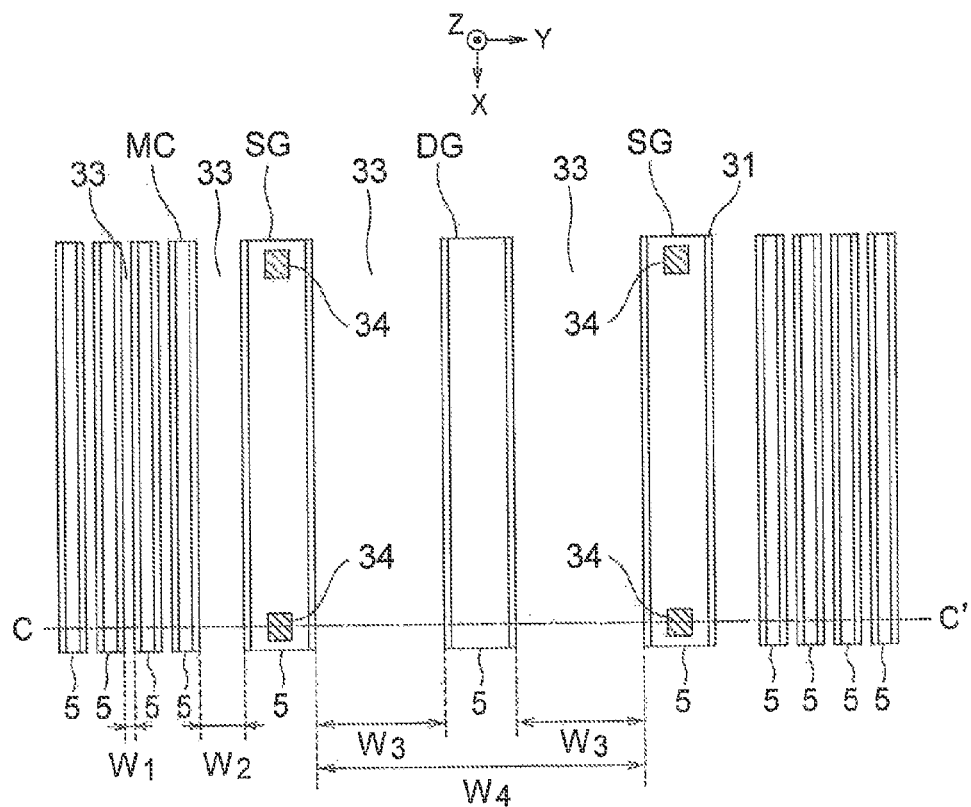

FIGS. 25A and 25B are a cross-sectional view and a plan view illustrating a method of manufacturing a semiconductor device of a variation of the second embodiment.

FIGS. 25A and 25B are the cross-sectional view and the plan view of the cell portion after the process of FIG. 22B is conducted, respectively. FIG. 25A illustrates the cross-section taken along line C-C' in FIG. 25B. In FIG. 25B, the mask layer 6 and the thin film 32 are omitted for convenience in drawing figures.

FIGS. 25A and 25B illustrate contact plugs 34 formed on the select transistors SG. The contact plugs 34 can be formed by forming contact holes that penetrate the thin film 32 and the mask layer 6 and reach the control gate material 5, and embedding the material of the contact plugs 34 in the contact holes. The contact plugs 34 are electrically connected to the control gate material 5. Furthermore, the contact plugs 34 are electrically connected to interconnects and via plugs in upper layers than the contact plugs 34.

In this variation, the contact plugs 34 are formed on the select transistors SG while not being formed on the dummy transistor DG. As a result, the select transistors SG are capable of functioning as transistors (MOSFET) while the dummy transistor DG is incapable of functioning as a transistor (MOSFET). It is noted that the control gate material 5 in each cell transistor MC is connected to a pad portion through a lead-out line of the control gate material 5 so as to be electrically connected to a contact plug 34 on the pad portion.

As described above, the dummy transistor DG is formed on the substrate 1 in addition to the cell transistors MC and the select transistors SG in the present embodiment. Accordingly, the present embodiment makes it possible to prevent that the thin film 32 is not transferred onto the substrate 1 in the region where the width of the gaps between the patterns is large and that the air gaps 33 are not formed in this region.

The width $W_3$ between a select transistor SG and the dummy transistor DG may be unequal. For example, the width $W_3$ between the dummy transistor DG and a select transistor SG on one side may differ from the width $W_3$ between the dummy transistor DG and a select transistor SG on the other side. In this case, the larger width $W_3$ is the maximum width. Similarly, the width $W_1$ and the width $W_2$ may be unequal.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
   forming a pattern portion and a flat portion on a substrate, the pattern portion including plural patterns, and the flat portion having a flat surface at a position lower than upper surfaces of the patterns; and
   transferring a first film on the substrate to continuously form the first film on the upper surfaces of the patterns and on the flat surface of the flat portion and to form a first air gap between the patterns.

2. The method of claim 1, wherein each of the patterns includes a device region of the substrate, a first insulator on the device region, and a first electrode material on the first insulator,
   the method further comprising:
   forming a second insulator on the first electrode material and the first film;
   forming a second electrode material on the second insulator; and
   removing the first film after forming the second electrode material.

3. The method of claim 2, further comprising removing the first film after forming the second electrode material to increase a volume of the first air gap.

4. The method of claim 2, further comprising removing a portion of the first film after forming the second electrode material to form a second air gap above the first air gap via the first film.

5. The method of claim 2, wherein each of the patterns includes one or more second films formed on the first electrode material.

6. The method of claim 5, wherein the first film is formed in a state where a height of a lower surface of the second films in each pattern is equal to a height of a lower surface of the second films in the flat portion.

7. The method of claim 5, wherein the first film is formed in a state where a height of an upper surface of the second films in each pattern is higher than a height of an upper surface of the second films in the flat portion.

8. The method of claim 5, further comprising removing the second films after forming the first film.

9. The method of claim 2, wherein each of the patterns includes a third film formed on side surfaces of the device region, the first insulator and the first electrode material and providing an upper surface of each pattern.

10. The method of claim 9, wherein the first film is formed in a state where a height of an upper surface of the third film in each pattern is higher than a height of an upper surface of the third film in the flat portion.

11. A method of manufacturing a semiconductor device, comprising:
    forming plural first patterns and one or more second patterns on a substrate, the first patterns being capable of functioning as transistors, and the second patterns being formed of the same material as the first patterns, being formed between the first patterns, and being incapable of functioning as transistors, and
    transferring a first film on the substrate to continuously form the first film on the first and second patterns and to form an air gap between mutually adjacent patterns among the first and second patterns.

12. The method of claim 11, wherein a maximum value of a width between the mutually adjacent patterns is smaller than 1000 times a minimum value of the width between the mutually adjacent patterns.

13. The method of claim 12, wherein the minimum value is a width between mutually adjacent first patterns.

14. The method of claim 13, wherein the minimum value is the width between the mutually adjacent first patterns functioning as cell transistors.

15. The method of claim 12, wherein the maximum value is a width between a first pattern and a second pattern which are mutually adjacent.

16. The method of claim 15, wherein the maximum value is the width between the first pattern functioning as a select transistor and the second pattern which are mutually adjacent.

17. The method of claim 11, wherein each of the first and second patterns includes a first insulator on the substrate, a first electrode material on the first insulator, a second insulator on the first electrode material, and a second electrode material on the second insulator.

18. The method of claim 11, further comprising selectively forming contact plugs on the first patterns functioning as select transistors among the first patterns functioning as the select transistors and the second patterns.

* * * * *